(12) United States Patent
Chiu et al.

(10) Patent No.: US 12,482,684 B2
(45) Date of Patent: Nov. 25, 2025

(54) CARRIER BOARD CONVEYING BOX WITH REINFORCED STRUCTURE

(71) Applicant: GUDENG PRECISION INDUSTRIAL CO., LTD., New Taipei (TW)

(72) Inventors: Ming-Chien Chiu, New Taipei (TW); Yung-Chin Pan, New Taipei (TW); Tzu-Ning Huang, New Taipei (TW); Chih-Ming Lin, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 121 days.

(21) Appl. No.: 17/986,905

(22) Filed: Nov. 15, 2022

(65) Prior Publication Data
US 2024/0055288 A1    Feb. 15, 2024

(30) Foreign Application Priority Data
Aug. 11, 2022  (TW) .................................. 111130286

(51) Int. Cl.
*H01L 21/677* (2006.01)
(52) U.S. Cl.
CPC ................. *H01L 21/6773* (2013.01)
(58) Field of Classification Search
CPC ........... H01L 21/6773; H01L 21/67379; H01L 21/67363; H01L 21/67366; H01L 21/67733
USPC ......................................... 294/67.1; 206/710
See application file for complete search history.

(56) References Cited

U.S. PATENT DOCUMENTS

| 1,879,756 | A | * | 9/1932 | Kuchta | B65D 7/28 |
|||||| 294/67.1 |
| 1,940,186 | A | * | 12/1933 | Romine | B66C 1/10 |
|||||| 410/38 |
| 4,191,415 | A | * | 3/1980 | Frei | B66C 1/66 |
|||||| 294/67.1 |
| 4,295,431 | A | * | 10/1981 | Stavlo | F17C 13/084 |
|||||| 294/67.1 |

(Continued)

FOREIGN PATENT DOCUMENTS

| JP | 2009302414 A | 12/2009 |
| JP | 2018012532 A | 1/2018 |

(Continued)

*Primary Examiner* — Ernesto A Grano
*Assistant Examiner* — Symren K Sanghera

(57) ABSTRACT

A carrier board conveying box with a reinforced structure comprises a container body, two clamping parts, and at least two reinforced structures. The container body has a top plate, a bottom plate, a plurality of side plates connecting the top plate and the bottom plate and a side opening. The top plate, the bottom plate, and the side plates are clamped to form an accommodating space. Two clamping parts are respectively disposed at two opposite sides of the container body. At least two reinforced structures are respectively disposed at the two opposite sides of the container body, and each of the reinforced structures is adjacent to a position of the side opening. The carrier board conveying box with a reinforced structure solves the problem of container distortion and deformation of the container body caused by load factors because of repeatedly bearing the weight of the carrier boards during transfer.

10 Claims, 5 Drawing Sheets

(56) References Cited

U.S. PATENT DOCUMENTS

| | | | | |
|---|---|---|---|---|
| 4,733,896 A * | 3/1988 | Klein | ................... | E04G 1/362 |
| | | | | 294/67.4 |
| 4,964,349 A * | 10/1990 | Bishop | ............... | B65D 90/0033 |
| | | | | 108/55.1 |
| 5,664,821 A * | 9/1997 | Crowson | .................. | B25H 3/00 |
| | | | | 410/116 |
| 7,997,213 B1 * | 8/2011 | Gauthier | ............. | B65D 88/022 |
| | | | | 294/67.1 |
| 8,292,081 B2 * | 10/2012 | Sasaki | ............... | H01L 21/67376 |
| | | | | 206/710 |
| 11,708,246 B2 * | 7/2023 | Myers | ...................... | B66C 1/10 |
| | | | | 294/81.1 |
| 2013/0099515 A1 * | 4/2013 | Guerrero | ............... | F17C 13/084 |
| | | | | 294/67.1 |

FOREIGN PATENT DOCUMENTS

| | | | |
|---|---|---|---|
| JP | 2022051676 A | | 4/2022 |
| TW | M508114 U | | 9/2015 |

* cited by examiner

CARRIER BOARD CONVEYING BOX WITH REINFORCED STRUCTURE

CROSS-REFERENCE TO RELATED APPLICATION

This non-provisional application claims priority under 35 U.S.C. § 119(a) on Patent Application No(s). 111130286 filed in Taiwan, R.O.C. on Aug. 11, 2022, the entire contents of which are hereby incorporated by reference.

BACKGROUND OF THE INVENTION

1. Field of the Invention

The present application relates to a carrier, and in particular to a carrier board conveying box with a reinforced structure.

2. Description of the Related Art

In the field of semiconductors, boards such as printed circuit boards are important products or semi-finished products. These boards may be an initial substrate ready for processing, a substrate that is in processing, or a finished substrate that has already completed processing. Regardless of the state of the substrate, it needs to be loaded and transported by a carrier to protect the substrate from collision of external forces and isolate the substrate from environmental pollution. In order to load more and larger substrates, the size of the carrier has gradually developed towards larger sizes.

In order to achieve the purpose of insulation and weight reduction, the commonly used material of the carriers is injection-molding plastic. Even so, the weight of the large-scale carrier plus the weight of the loaded substrates may still be as high as 70 kg or even 100 kg. Such a carrier easily produces problems of insufficient support and strength, and when the mechanical arm clamps the carrier, it is easy to cause excessive concentration of gravity, resulting in distortion and deformation of the plastic box.

BRIEF SUMMARY OF THE INVENTION

Therefore, in order to solve the various problems of the traditional carrier, the present invention provides a carrier board conveying box with a reinforced structure.

To achieve the above objective and other objectives, the present application provides a carrier board conveying box with a reinforced structure, which comprises: a container body, having a top plate, a bottom plate, a plurality of side plates connecting the top plate and the bottom plate and a side opening. The top plate, the bottom plate and the side plates are clamped to form an accommodating space. Two clamping parts are respectively disposed at two opposite sides of the container body. At least two reinforced structures are respectively disposed at the two opposite sides of the container body, and each of the reinforced structure is adjacent to a position of the side opening.

In an embodiment of the application, the at least two reinforced structures are longitudinal rods of carbon fiber material.

In an embodiment of the application, the at least two reinforced structures are buried and fixed to the position adjacent to the side opening of the container body.

In an embodiment of the application, a contiguous place of the top plate and the side plate is provided with at least two mounting pieces, the two mounting pieces are respectively used to mount and fix the reinforced structure at the opposite sides of the container body.

In an embodiment of the application, the clamping part is a side plate clamping structure.

In an embodiment of the application, each of the clamping parts is an Overhead Hoist Transfer (OHT) structure, including a clamping crossbar and a base crossbar that are correspondingly configured, the reinforced structure is a longitudinal rod connecting the clamping crossbar and the base crossbar.

In an embodiment of the application, the number of reinforced structures is a plurality of longitudinal rods, the plurality of longitudinal rods are set apart from each other between the clamping crossbar and the base crossbar.

In an embodiment of the application, the clamping crossbar and the base crossbar respectively include an accommodating hole, a first convex part, and a fastener that are provided corresponding to the longitudinal rod, the first convex part is bulged from a hole wall of the accommodating hole, the longitudinal rod has a first neck that matches the first convex part, the fastener is set in the accommodating hole, and clamps the first neck with the first convex part.

In an embodiment of the application, the clamping crossbar includes an accommodating hole, a first convex part, and a fastener that are provided corresponding to the longitudinal rod, the first convex part is bulged from a hole wall of the accommodating hole, an end of the longitudinal rod has a first neck that matches the first convex part, the fastener is set in the accommodating hole, and clamps the first neck with the first convex part, the base crossbar is configured to correspond with a position of the clamping crossbar, and the base crossbar is used to connect to another end of the longitudinal rod.

In an embodiment of the application, the base crossbar includes a clamping groove, a second convex part, and an engagement piece that are provided corresponding to the longitudinal rod, the second convex part is bulged from a groove wall of the clamping groove, an end of the longitudinal rod has a second neck that matches the second convex part, the engagement piece is locked at one side of the clamping groove, and the engagement piece clamps the second neck with the second convex part, the clamping crossbar is configured to correspond with a position of the base crossbar, and the clamping crossbar is used to connect to another end of the longitudinal rod.

In an embodiment of the application, the clamping crossbar includes an accommodating hole, a first convex part, and a fastener that are provided corresponding to the longitudinal rod, the first convex part is bulged from a hole wall of the accommodating hole, the longitudinal rod has a first neck that matches the first convex part, the fastener is set in the accommodating hole, and clamps the first neck with the first convex part, and the base crossbar includes a clamping groove, a second convex part and an engagement piece that are provided corresponding to the longitudinal rod, the second convex part is bulged from a groove wall of the clamping groove, the longitudinal rod has a second neck that matches the second convex part, the engagement piece is locked at one side of the clamping groove, and the engagement piece clamps the second neck with the second convex part.

In an embodiment of the application, the carrier board conveying box further comprises at least one base rib bar, the base rib bar is connected to the two base crossbars 3 at each end, and the base rib bar is away from the side opening.

In an embodiment of the application, the top plate is provided with a guide groove.

In summary, the carrier board conveying box of the present application uses technical means of mounting or burying to set at least two reinforced structures at the container body that can increase the structural strength of the container body, and then strengthen the support capacity, in order to solve the problem of deformation caused by compression or uneven force when transferring the container body.

DETAILED DESCRIPTION OF THE INVENTION

To facilitate understanding of the present application, embodiments together with the attached drawings for the detailed description of the present application are provided. One skilled in the art can understand the object, characteristics, and effects of this present application by the content described in the specification. It should be noted that various possible modifications and alterations to the details of the specification could be carried out by implementing or applying other different embodiments based on different views and applications without departing from the spirit of the present application. The related technical contents of the application will be described in detail by the embodiments. However, the disclosed contents should not be considered to limit the scope of the application. The description is provided as follows.

Figure 1:
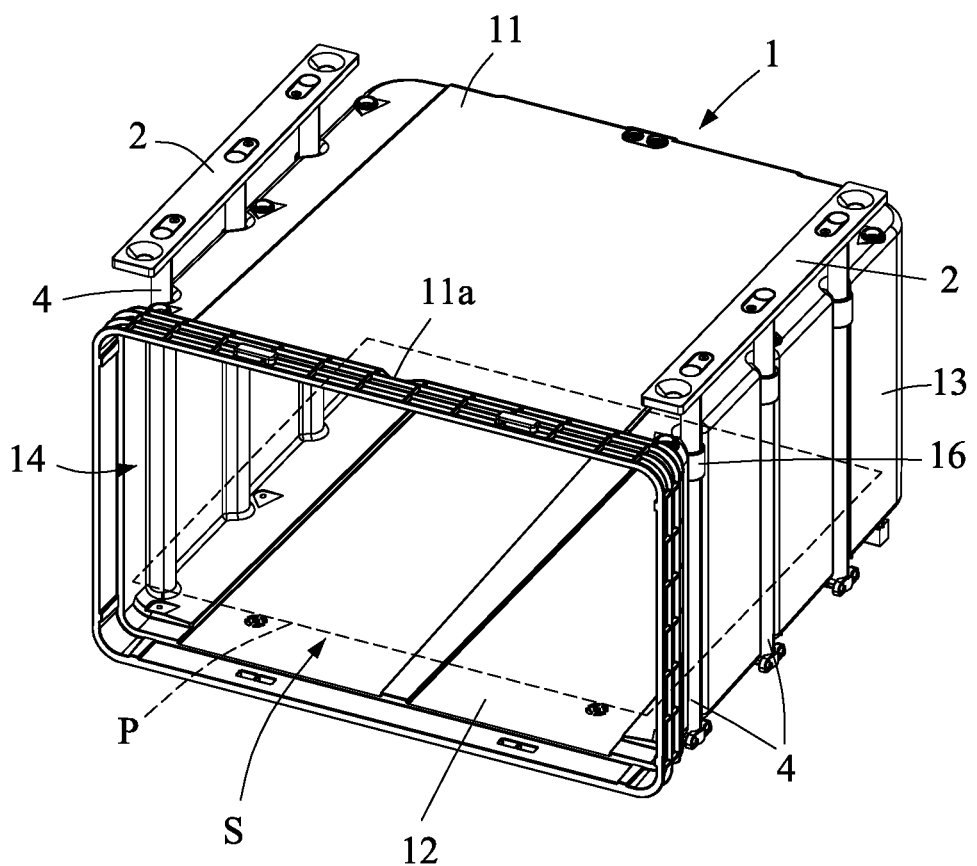
FIG. 1 is a perspective view schematic diagram of a carrier board conveying box according to an embodiment of the present application.

As shown in FIG. 1, a carrier board conveying box 100 with a reinforced structure of an embodiment of the present application comprises a container body 1, two clamping parts, and at least two reinforced structures 4.

The container body 1 has a top plate 11, a bottom plate 12, a plurality of side plates 13 connecting the top plate 11 and the bottom plate 12 and a side opening 14. The top plate 11, the bottom plate 12 and each of the side plates 13 are clamped to form an accommodating space S. In the present embodiment, the accommodating space S is used to accommodate various boards P, such as a printed circuit board, each of the boards P is preferably arranged in parallel sequentially, stacked. However, the present application is not limited thereto, the accommodating space S may also be used to accommodate other types or shapes of the article. The container body 1 may further include a door cover (not shown), disposed on the side opening 14, for sealing the accommodating space S. The material of the container body 1 is preferably a lightweight, wear-resistant, and insulating material, such as an insulating plastic material formed by injection molding.

The clamping parts are disposed at two opposite sides of the container body 1 for automatic instrument clamping or manual holding. The structural design of the clamping part is described in detail below.

At least two reinforced structures 4 are disposed at the two opposite sides of the container body 1. Each of the reinforced structure 4 is adjacent to a position of the side opening 14 (located at two sides of the side opening 14) to strengthen the structural strength of the container body 1 and improve the loading capacity, in order to solve the problem of deformation of the container body 1 or damage to the container body 1. In an embodiment, the type of the reinforced structure 4 is a longitudinal rod. However, the present application is not limited thereto, the type of the reinforced structure 4 may be changed as needed.

Further, at least two reinforced structures 4 are preferably longitudinal rods of carbon fiber material, carbon fiber material has the advantages of high strength and light weight, which can solve the problem of container distortion and deformation of the container body 1 caused by load factors because of repeatedly bearing the weight of the carrier boards and the transfer operation.

Further, the reinforced structure 4 may be buried and fixed to the position adjacent to the side opening 14 of the container body 1, or a mounting piece is used to mount and fix the reinforced structure 4 to the position adjacent the side opening 14 of the container body 1. In an embodiment, taking the mounting piece as an example, the mounting pieces are respectively used to mount and fix the reinforced structure 4 at the two opposite sides of the container body 1, the mounting piece may be a casing ring 16. In detail, the casing ring 16 is provided at a contiguous place of the top plate 11 and the side plate 13, the reinforced structure 4 is used to run through the corresponding casing ring 16 and is fixed to the side of the container body 1. However, the present application is not limited to thereto, the structural design and mounting position of the mounting piece may be changed according to the needs. For example, the mounting piece may be locked by screws, or butted and engaged by the male and female buckle, or other structural design, as long as the reinforced structure 4 can be applied to the container body 1, all belong to the scope of patent protection of the present application.

Figure 2:
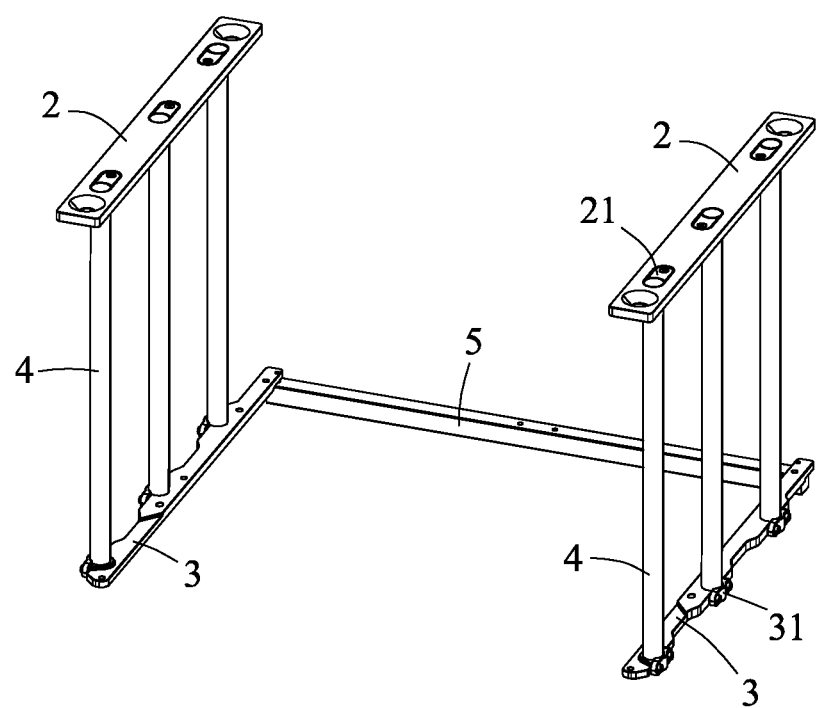
FIG. 2 is a perspective view schematic diagram of a load frame according to an embodiment of the present application.

Referring to FIGS. 1 and 2 together, FIG. 2 is a perspective view schematic diagram of a load frame according to an embodiment of the present application. The load frame is mounted on the container body 1. In an embodiment, the load frame comprises clamping parts, reinforced structures 4, and a base rib bar 5. The two clamping parts are Overhead Hoist Transfers structures (OHT), and each of the clamping parts includes a clamping crossbar 2 and a base crossbar 3 that are correspondingly configured, two clamping crossbars 2 are mounted at relative two upper sides of the container body 1 (i.e., above the top plate 11), and the automated clamping instrument may grab the crossbars 2 from the upper side of the container body 1, and lift the container body 1.

The two base crossbars 3 are provided at two opposite sides of the base plate 12, and positions of the two base crossbars 3 corresponds to the two clamping crossbars 2. In other words, there is a base crossbar 3 under each of the clamping crossbars 2, and the clamping crossbar 2 is roughly parallel to the corresponding base crossbar 3. The reinforced structure 4 is a longitudinal rod connecting the clamping crossbar 2 and the base crossbar 3, for example, two ends of the longitudinal rod are respectively connected to the clamping crossbar 2 and the base crossbar 3 as the structural strength of the container body 1 itself, enough to support the weight of the carrier boards that can be loaded into the container body 1. Specifically, through the structural design of the load frame, when the automated clamping instrument clamp s and lifts the clamping crossbar 2, the clamping crossbar 2 links the reinforced structure 4 and the base crossbar 3, and the original load concentrated on the container body 1 can be transferred to the base crossbar 3, and in the process of load transfer, the longitudinal rod of the carbon fiber material can provide support capacity with sufficient strength. Accordingly, the problem that container body 1 of plastic material is compressed and deformed inward that is caused by load factors in the process of transferring the container body 1 can be solved. In an embodiment, the connection method between the reinforced structure 4, the clamping crossbar 2 and the base crossbar 3 may be welding, engagement, locking, or any structural design that may be used for connection and fixation, the present application is not limited to the connection method.

The number of reinforced structures 4 may be increased in response to actual operational needs, in an embodiment, the number of reinforced structures 4 that is a plurality of longitudinal rods is illustrated as an example, the plurality of longitudinal rods are set apart from each other between the clamping crossbar 2 and the base crossbar 3, in order to balance force situation of the load frame in the process of transferring the load.

Figure 3:
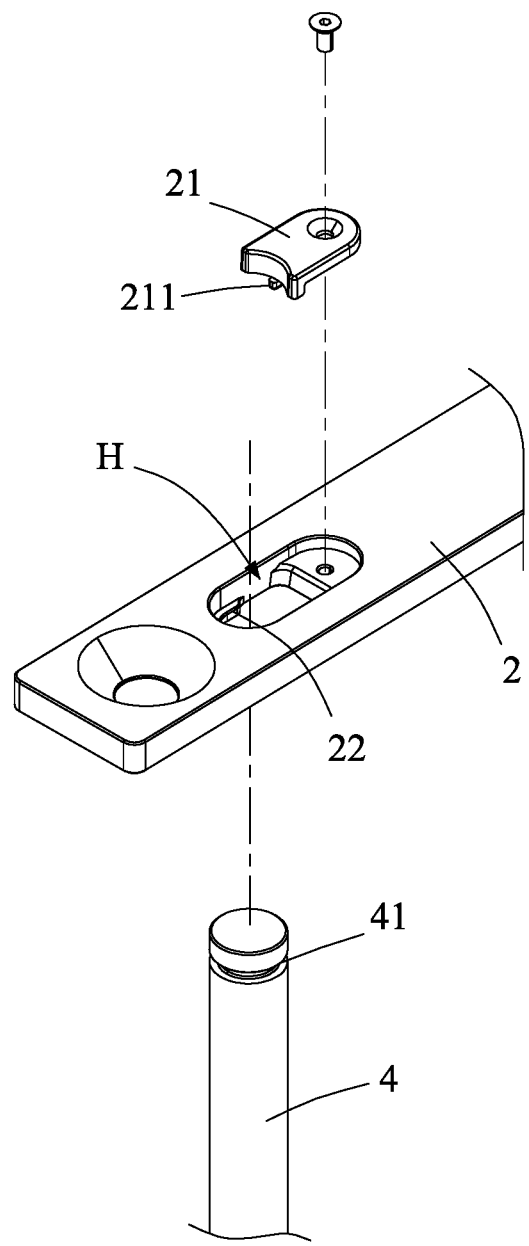
FIG. 3 is a partially enlarged exploded view schematic diagram of a clamping part according to an embodiment of the present application.

As shown in FIG. 3, FIG. 3 is a partially enlarged exploded view of a clamping part according to an embodiment of the present application. In an embodiment, the clamping crossbar 2 and the base crossbar 3 of the clamping part may be the same structure, the detailed structure design of the clamping crossbar 2 is illustrated herein as an example. The clamping crossbar 2 includes an accommodating hole H, a first convex part 22 and a fastener 21 that are provided corresponding to the longitudinal rod (reinforced structure 4). The first convex part 22 is bulged from a hole wall of the accommodating hole H, an end of the longitudinal rod has a first neck 41 that matches the first convex part 22, the longitudinal rod is extended into the accommodating hole H and the first neck 41 is oriented towards the first convex part 22, the first convex part 22 and the first neck 41 are mated with each other, and then the fastener 21 is set in the accommodating hole H, and two sides of the fastener 21 respectively abut against an outer side of the longitudinal rod and an inner wall of the accommodating hole H, and the fastener 21 is fixed to the other side of the accommodating hole H by means of locking and so on. Therefore, the longitudinal rod is clamped between the first convex part 22 and the fastener 21, whereby it is fixed in the accommodating hole H.

Further, the fastener 21 may also have an extension part 211 protruding towards the first neck 41 of the longitudinal rod, when the first convex part 22 and the fastener 21 clamp the longitudinal rod, the extension part 211 protrudes into the first neck 41 to further enhance the stability of the assembly. However, the fastener 21 may be designed with other shapes and structures, together with the first convex part 22 to support the longitudinal rod, the present application does not limit the structural aspects of the fastener 21.

In an embodiment, the two clamping crossbars 2, the two base crossbars 3 and at least two reinforced structures 4 are rigid pieces, i.e., they are materials such as metal, carbon fiber composite materials, that do not easily stretch and deform relative to the plastic pieces.

As mentioned earlier, the clamping crossbar 2 and the base crossbar 3 may be the same structure, so the base crossbar 3 of the same structure is no longer further drawn. In other examples, only the clamping crossbar 2 includes the aforementioned accommodating hole H, the first convex part 22 and the fastener 21, and a position that the base crossbar 3 is configured corresponding to the clamping crossbar 2 may be connected to the other end of the longitudinal rod in other unlimited forms. Other forms, for example, are screw locking in different embodiments, the male and female buckle butting engagement, or other structural design, may also be that the base crossbar 3 is integrally formed to connect to the longitudinal rod.

Figure 4:
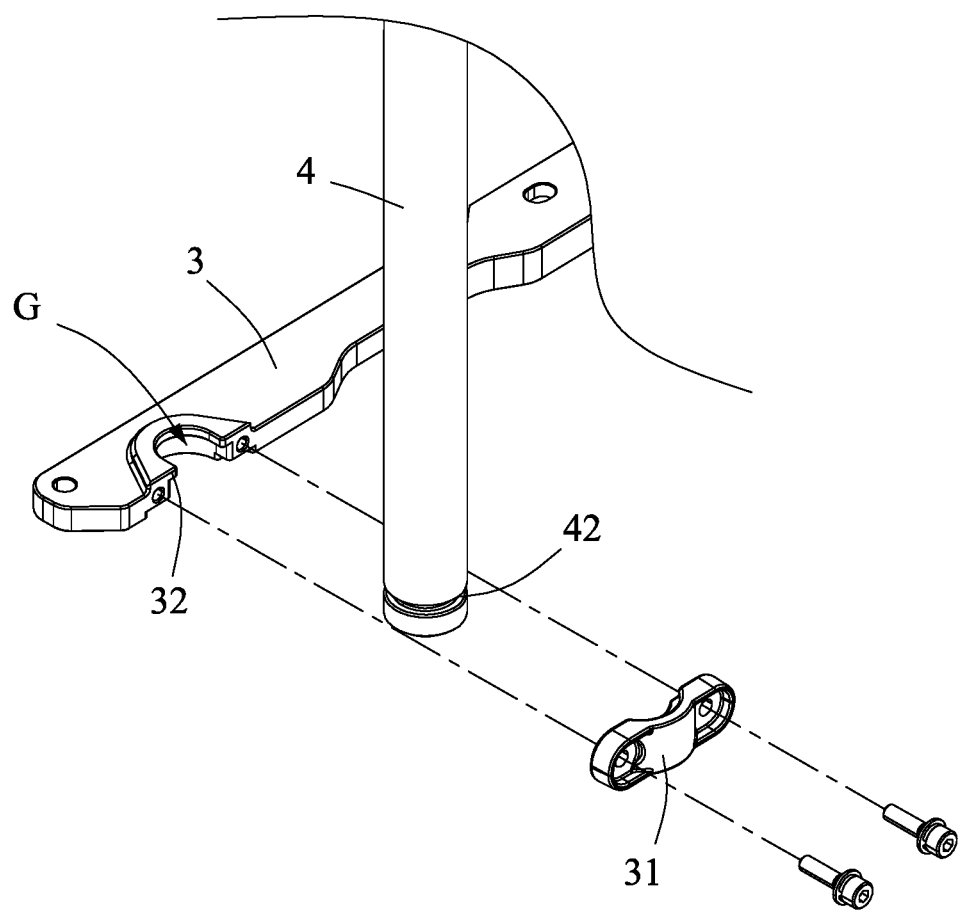
FIG. 4 is a partially enlarged exploded view schematic diagram of another clamping part according to an embodiment of the present application.

As shown in FIG. 4, FIG. 4 is a partially enlarged exploded view of another clamping part according to an embodiment of the present application. The clamping crossbar 2 and the base crossbar 3 of the clamping part may be different structures, and it is only stated herein the detailed structure design that the base crossbar 3 is different from the clamping crossbar 2 described above. The base crossbar 3 further includes a clamping groove G, a second convex part 32, and an engagement piece 31. The second convex part 32 is bulged from an inner groove wall of the clamping groove G, the longitudinal rod (reinforced structure 4) has a second neck 42 that matches the second convex part 32, the longitudinal rod is extended into the clamping groove G and the second neck 42 is oriented towards the second convex part 32, the second convex part 32 and the second neck 42 are mated with each other at one side of the clamping groove G. Then, the engagement piece 31 is fixed to the other side of the clamping groove G by means of locking, etc., so the longitudinal rod is clamped between the second convex part 32 and the engagement piece 31, whereby it is fixed in the clamping groove G. Various commonly used engagement methods may be applied to the connection of the base crossbar 3 and the reinforced structure 4, the present application does not limit the structural aspects of the connection.

As mentioned earlier, although it is disclosed that the different detail structures connecting to the longitudinal rod of the clamping crossbar 2 and the base crossbar 3; in other examples, however, the specific aspect of the clamping crossbar 2 connecting to the longitudinal rod is not limited. As long as the clamping crossbar 2 is configured to correspond to the position of the base crossbar 3, and the clamping crossbar 2 is used to connect the other end of the longitudinal rod, it will function. The way of the clamping crossbar 2 connecting to the longitudinal rod for example, is screw locking in different embodiments, the male and female buckle butting engagement, or other structural design, and may also be that the clamping crossbar 2 is integrally formed to connect to the longitudinal rod.

In an embodiment, as shown in FIG. 2, the carrier board conveying box 100 further comprises at least one base rib bar 5. The base rib bar 5 is connected to the two base crossbars 3 at each end. The base rib bar 5 is used to enhance the load bearing capacity of the base crossbar 3. When the automated clamping instrument grabs the two clamping crossbars 2 as the force point and lifts, the clamping instrument drives the reinforced structure 4 at the side of the container body 1, the reinforced structure 4 links the base crossbar 3 and the base rib bar 5, so that the original load concentrated on the container body 1 can be transferred to the base crossbar 3 and the base rib bar 5, which can prevent the deformation of the container body 1 caused by uneven force or excessive bearing, material fatigue, and other reasons.

Preferably, the base rib bar 5 is far from the side opening 14, i.e., located at a rear side of the carrier board conveying box 100. The existing carrier board conveying box 100 carries a plurality of carrier boards, and the load bearing position of the carrier boards will be closer to the rear side of the carrier board conveying box 100, so that the load weight of the rear side is greater than that of the side opening 14, so the present application increases the base rib bar 5 to strengthen the force capacity of the load frame in the process of transferring the load. Certainly, the setting position and number of base rib bars 5 can be adjusted according to the actual application needs.

In an embodiment, as shown in FIG. 1, when transferring the container body 1 to the loading device (load port), because of the volume or height factor of the container body 1, only the bottom plate 12 of the container body 1 can be engaged to the loading device, but a position of the top plate 11 of the container body 1 can easily shake and cause position shift. Thus, the top plate 11 of the present application is provided with a guide groove 11*a*, and a position of the guide groove 11*a* is adjacent to the side opening 14. The loading device has a positioning part (not shown in the drawing) matching the guide groove 11*a*. When the automated clamping instrument transfers the carrier board conveying box 100 to the loading device, the positioning part of the loading device will correspond to the position of the guide groove 11*a* to carry out the connection and positioning. It is worth noting that the container body 1 may use the guide groove 11*a* to carry out the alignment function of the position offset to improve the accuracy of the container body 1 at the time of loading. The structural design of the guide groove 11*a* may be V-shaped, but the present application is not limited thereto, the geometry of the guide groove 11*a* may be changed and adjusted according to the needs.

Figure 5:
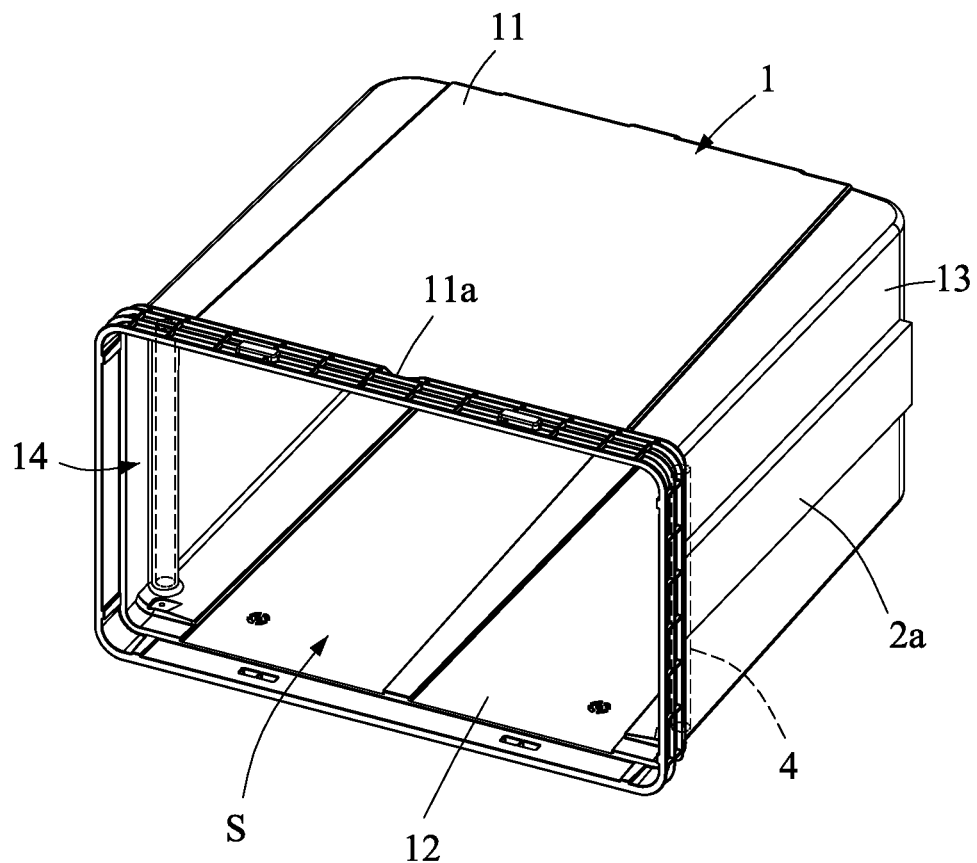
FIG. 5 is a perspective view schematic diagram of a carrier board conveying box according to an embodiment of the present application.

In addition to the above-described embodiments that the mounting piece is used to mount and fix the reinforced structure 4 at the position adjacent the side opening 14 of the container body 1, as shown in FIG. 5. FIG. 5 is a perspective view schematic diagram of a carrier board conveying box 100*a* according to an embodiment of the present application. It is only stated herein the difference between embodiments, the reinforced structure 4 may be buried and fixed to a position adjacent to the side opening 14 of the container body 1. The two clamping parts may be side plate clamping structures 2*a*, the side plate clamping structure 2*a* is extended outward from a surface of the side plate 13. The automated clamping instrument may grab the side plate clamping structures 2*a* from the side plate 13 of the container body 1 and lift the container body 1. Certainly, the side plate clamping structure 2*a* may also be a handle, which is mounted on the side plate 13 of the container body 1, or the side plate 13 of the container body 1 is designed with a clamping groove for the automated clamping instrument to clamp and transfer the load, the present application does not limit the aspect of structural design of the side plate clamping structure 2*a*.

While the present application has been described by means of specific embodiments, those skilled in the art should understand the above description is merely embodiments of the application, and it should not be considered to limit the scope of the application. It should be noted that all changes and substitutions which come within the meaning and range of equivalency of the embodiments are intended to be embraced in the scope of the application. Therefore, the scope of the application is defined by the claims.

What is claimed is:

1. A carrier board conveying box with a reinforced structure, comprising:
   a container body, having a top plate, a bottom plate, a plurality of side plates connecting the top plate and the bottom plate and a side opening, the top plate, the bottom plate and the side plates form an accommodating space;
   two clamping parts, respectively disposed at two opposite sides of the container body; and
   at least two reinforced structures, respectively disposed at the two opposite sides of the container body, and each of the reinforced structures is adjacent to a position of the side opening,
   wherein each of the clamping parts includes a clamping crossbar and a base crossbar that are correspondingly configured, and each of the reinforced structures is a longitudinal rod connecting the clamping crossbar and the base crossbar; and
   wherein the clamping crossbar includes an accommodating hole, a first convex part, and a fastener that are provided corresponding to the longitudinal rod, the first convex part is bulged from a hole wall of the accommodating hole, the longitudinal rod has a first neck that matches the first convex part, the fastener is set in the accommodating hole and clamps the first neck with the first convex part; and the base crossbar includes a clamping groove, a second convex part, and an engagement piece that are provided corresponding to the longitudinal rod, the second convex part is bulged from a groove wall of the clamping groove, the longitudinal rod has a second neck that matches the second convex part, the engagement piece is locked at one side of the clamping groove, and the engagement piece clamps the second neck with the second convex part.

2. The carrier board conveying box with a reinforced structure according to claim 1, wherein the longitudinal rod of the at least two reinforced structures is carbon fiber material.

3. The carrier board conveying box with a reinforced structure according to claim 1, wherein the at least two reinforced structures are fixed to the position adjacent to the side opening of the container body.

4. The carrier board conveying box with a reinforced structure according to claim 1, wherein each of the side plates is provided with at least two mounting pieces, the two mounting pieces are respectively used to mount and fix the reinforced structure at the opposite sides of the container body.

5. The carrier board conveying box with a reinforced structure according to claim 1, wherein the reinforced structures are set apart from each other between the clamping crossbar and the base crossbar.

6. The carrier board conveying box with a reinforced structure according to claim 1, wherein the clamping crossbar and the base crossbar respectively include the accommodating hole.

7. The carrier board conveying box with a reinforced structure according to claim 1, wherein an end of the longitudinal rod has the first neck, the base crossbar is configured to correspond with a position of the clamping crossbar, and the base crossbar is used to connect to another end of the longitudinal rod.

8. The carrier board conveying box with a reinforced structure according to claim 1, wherein an end of the longitudinal rod has the second neck, the clamping crossbar is configured to correspond with a position of the base crossbar, and the clamping crossbar is used to connect to another end of the longitudinal rod.

9. The carrier board conveying box with a reinforced structure according to claim 1, further comprising at least one base rib bar, the base rib bar is connected to the two-base crossbar of the two clamping parts, and the base rib bar is away from the side opening.

10. The carrier board conveying box with a reinforced structure according to claim 1, wherein the top plate is provided with a guide groove.

\* \* \* \* \*